United States Patent [19]
Rosen et al.

[11] Patent Number: 6,076,965
[45] Date of Patent: Jun. 20, 2000

[54] MONOCRYSTAL OF NICKEL-COBALT-MANGANESE OXIDE HAVING A CUBIC SPINEL STRUCTURE, METHOD OF GROWTH AND SENSOR FORMED THEREFROM

[75] Inventors: Carol Zwick Rosen, Teaneck, N.J.; Donald G. Wickham, Malibu, Calif.

[73] Assignee: Therometrics, Inc., Edison, N.J.

[21] Appl. No.: 08/877,415

[22] Filed: Jun. 17, 1997

Related U.S. Application Data

[60] Provisional application No. 60/019,862, Jun. 17, 1996.

[51] Int. Cl.$^7$ ............................................. G01K 7/22
[52] U.S. Cl. .......................... 374/185; 423/594; 423/599; 338/22 R; 338/225 D
[58] Field of Search ................................. 423/594, 599; 374/185; 117/946; 338/22 R, 225 D, 25

[56] References Cited

U.S. PATENT DOCUMENTS

| | | |
|---|---|---|
| 3,343,151 | 9/1967 | Brown et al. . |
| 3,510,820 | 5/1970 | Jonker et al. . |
| 3,568,125 | 3/1971 | Villemant et al. . |
| 3,612,535 | 10/1971 | David et al. . |
| 3,846,776 | 11/1974 | Kahn . |
| 3,876,382 | 4/1975 | Falckenberg . |
| 4,324,702 | 4/1982 | Matsuo et al. . |
| 4,347,166 | 8/1982 | Tosaki et al. . |
| 4,519,870 | 5/1985 | Matsuzawa et al. . |
| 4,729,852 | 3/1988 | Hata . |
| 4,840,925 | 6/1989 | Rousset et al. . |
| 4,891,158 | 1/1990 | Hata . |
| 5,043,692 | 8/1991 | Sites et al. . |
| 5,246,628 | 9/1993 | Jung et al. . |
| 5,653,954 | 8/1997 | Rosen et al. . |
| 5,830,268 | 11/1998 | Rosen et al. . |

FOREIGN PATENT DOCUMENTS

| | | |
|---|---|---|
| 0 609 776 A1 | 8/1994 | European Pat. Off. . |
| 0 687 656 A1 | 12/1995 | European Pat. Off. . |
| 2-143502 | 6/1990 | Japan . |
| 3-136206 | 6/1991 | Japan . |
| 3-214702 | 9/1991 | Japan . |
| 3-214703 | 9/1991 | Japan . |

OTHER PUBLICATIONS

Suzuki, "A.c. Hopping conduction in Mn–Co–Ni–Cu Complex Oxide Semiconductors with Spinel Structure" The journal of Physics and chemistry of solids vol. 41 pp 1253–60, 1980.

D.G. Wickham, "Solid–Phase Equilibria in the System $NiO-Mn_2O_3-O_2$", *J. Inorg. Nucl. Chem.*, vol. 26, (1964), pp. 1369–1377.

E.G. Larson, R.J. Arnott and D.G. Wickham, "Preparation, Semiconduction and Low–Temperature Magnetization of the System $Ni_{1-x}Mn_{2+x}O_4$", *J. Phys. Chem. Solids*, vol. 23, (1962), pp. 1771–1781.

D.G. Wickham and W.J. Croft, "Crystallographic and Magnetic Properties of Several Spinels Containing Trivalent Manganese", *J. Phys. Chem. Solids*, Pergamon Press, vol. 7, (1958), pp. 351–360.

(List continued on next page.)

*Primary Examiner*—Diego Gutierrez
*Assistant Examiner*—Maria Fernandez
*Attorney, Agent, or Firm*—Lerner, David, Littenberg, Krumholtz & Mentlik, LLP

[57] ABSTRACT

A nickel-cobalt-manganese oxide monocrystal having a cubic spinel structure over a broad concentration range of manganese/cobalt/nickel, including the entire possible range of manganese to nickel ratios, provided that the resulting monocrystal has a cubic spinel structure. A flux method is described for producing the monocrystals. Also disclosed are sensors, based on the monocrystals, having desirable electrical properties In particular, the sensors of the present invention are highly accurate temperature sensors or thermistors having high sensitivity, good reproducibility and improved aging characteristics. Performance of a sensor based on the monocrystal permits the preparation of a thermistor standard which can be used to evaluate the performance of ceramic devices.

10 Claims, 12 Drawing Sheets

OTHER PUBLICATIONS

Yokohama et al., "Formation of a cubic spinel from a manganese cobalt nickel oxide thermistor material and its electrical properties," *Zairo Kagaku*, vol. 28, No. 5, (Sep. 1991), pp. 271–275.

Yokoyama et al., "Influence of firing atmosphere on crystal structure of manganese–cobalt–nickel oxide for thermistor material," *Nippon Seramikkusu Kyokai Gakujutsu Ronbunshi*, vol. 97, No. 4, (Apr. 1989), pp. 427–431.

V.A.M. Brabers and J.C.J.M. Terhell, "Electrical Conductivity and Cation Valencies in Nickel Manganite," *Department of Physics, University of Technology, Eindhonen*, The Netherlands, 1982, pp. 325–332.

Leonid V. Azároff, "Formation, structure, and bonding of Ni–Co–Mn oxides having spinel–type strukture," *Zeitschrift für Kristallographice*, Bd. 112, S. 33–43 (1959).

H. Makram, "Growth of Nickel Manganite Single Crystals," *Journal of Crystal Growth 1*, 1967, North–Holland Publishing Co., Amsterdam, pp. 325–326.

G. Villers & R. Buhl, "Preparation, etudes cristallines et magnetiques du manganite de nickel $NiMn_2O_2$," *C.R. Acad. Sc. Paris, t. 260*, 1965, Groupe 8, pp. 3406–3409.

J. Ross Macdonald, *Impedance Spectroscopy—Emphasizing Solid Materials and Systems*, pp. 1–26 (no date).

Sasamoto et al., "Crystal structure and electrical property of manganese iron cobalt nickel oxide for thermistor materials in the manufacturing process," *Key Eng. Mater.*, vol. 53–55, (1991), pp. 101–106.

Yokoyama et al., "Preparation and electrical properties of monophase cubic spinel, Mn1.5Co).95NiO.5504, derived from rock salt type oxide," *J. Mater. Sci.*, vol. 30, No. 7, (1995), pp. 1845–1848.

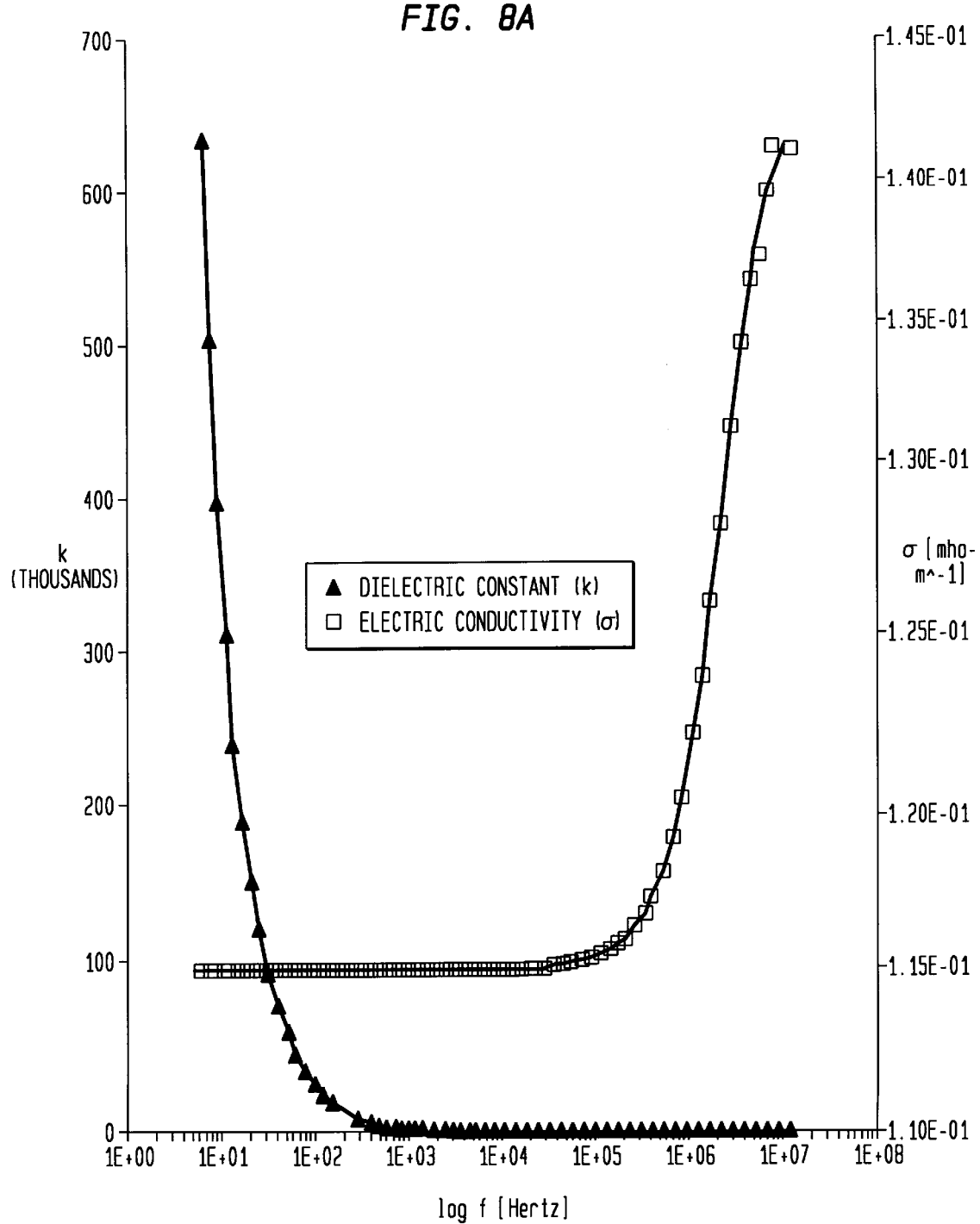

MONOCRYSTAL OF NICKEL-COBALT-MANGANESE OXIDE HAVING A CUBIC SPINEL STRUCTURE, METHOD OF GROWTH AND SENSOR FORMED THEREFROM

This Appln claims the benefit of U.S. Provisional Appln No. 60/019,862, filed Jun. 17, 1996.

TECHNICAL FIELD

The invention relates to the field growing monocrystals, particularly of nickel-cobalt-manganese-oxide with cubic spinel structure, methods of their production and their use as thermistors.

BACKGROUND ART

Monocrystalline materials sometimes offer a high degree of uniformity in terms of their physical properties as well as a high degree of repeatability and efficiency when compared to polycrystals of the same material. When monocrystals with these properties are discovered, they are highly prized as replacements for polycrystalline materials, wherever such materials are used. Moreover, monocrystalline materials may also be sought out for applications for which polycrystalline material would never be considered. For example, in optical applications, polycrystals will provide a diffuse reflection of incident light whereas monocrystals would yield specular reflection.

However, while monocrystals are desirable, the technical problems associated with their fabrication are significant. The methods employed to produce polycrystals are inadequate for the production of larger single crystals. Finding an appropriate method of growing monocrystals can be completely unpredictable. For example, if a system is useful for the production of a binary metal oxide crystal, it does not follow that the same production protocol would be useful for producing a ternary crystal, even when two of the three metals involved were successfully grown in the binary system. In fact, even if a flux system was useful in growing one specific binary metal crystal, there is no way to predict how that same flux system would behave if one of the metals was exchanged for another.

Moreover, it is nearly impossible to predict how a growth/flux system will behave. The same amounts of starting materials could yield crystals of different structure and composition when produced using different types of flux.

Finally, while the properties of monocrystals are often superior to their polycrystalline counterparts, there is no way to predict the relative behavior of monocrystals based on polycrystals. In fact, there are times when monocrystals exhibit inferior properties when compared to polycrystals. For example, some devices such as ceramic ferrite memory cores, depend on the random orientation of many small grains. Single crystals do not work. Even when the properties are superior, there is no way to predict the degree of improvement.

In accordance with the present invention, and indeed generally, monocrystals can be differentiated from polycrystals based on a number of factors. Monocrystals are sized and shaped such that they can be used individually in the production of sensors, probes and the like. Polycrystalline materials are those made up of a composite of many individual crystals. Many ceramic materials are polycrystalline in nature as are many rocks and fabricated metals. The size of these polycrystals are usually small with equivalent diameters in many materials varying from a few micrometers to about 100 micrometers. Much larger crystallites are possible. However, because of physical properties such as, for example, packing density and other issues common in the ceramics field, it is usually advantageous to insure that the individual crystals do not get too large and are of as uniform a size and composition as possible. In the context of the present invention, however, when referring to a single crystal, preferably, an isolated crystal which is large enough to manipulate i.e. sliced or shaped, is envisioned. This allows one to take advantage of the properties of same with respect to the individual orientation of the crystal. In preferred embodiment, individual crystals are about 100 microns in size or greater and more preferably, at least about a millimeter in size or greater, along one edge. Certainly, crystals of a centimeter on a single edge would be considered rather large.

There are other significant differences as well, most of which stem directly from the fact that monocrystals are, as their name implies, singular, whereas polycrystals involve the interaction of at least two crystals and suffer from charge carrier scattering at their grain boundaries, where modifications to the electric conductivity likely take place. In fact, transport processes such as resistivity and dielectric properties of the crystal differ considerably from those of ceramic samples. Polycrystalline materials can be thought of as a composite material made up of two or more distinct individual components. Just as the polycrystalline materials are composites of the individual crystals, so too are their properties. Polycrystals have voids and often certain other stoichiometry and phases. These features each have an effect on the overall properties of the material and any device or sensor made using them. For example, the resistivity ($\rho$) of these semiconducting monocrystals is somewhat less than that of the corresponding semiconducting polycrystals of that same material because of the presence of grain boundaries. The permitivity ($\epsilon$) of the polycrystalline material is also affected thereby. Monocrystals, which do not suffer from such composite properties will not exhibit such a strong dispersion in their impedance-frequency characteristics.

Moreover, since no two groups of polycrystals can be exactly the same, i.e. same number of crystals of identical size, orientation, stoichiometry and composite properties, the response of one sensor made with one group of polycrystals may vary with respect to other such sensors. Polycrystals may also be problematic because they may absorb water, particularly in the voids between crystals. When such material is exposed to variations in humidity, "aging" or a lack of reproducibility of properties over temperature may be accelerated in comparison to comparable monocrystals. Moreover, the size of the voids between individual polycrystals may change with time and exposure to the elements and in response to external electric fields. Again, the thermal and electrical properties of the resulting material may therefore change over time. Monocrystals do not suffer from these same aging limitations.

Finally, with regard to certain materials and in particular cubic spinel crystals, there may be magnetic ordering effects at lower temperatures in monocrystals. But with polycrystals, exposure to a magnetic field may cause distortion of the individual crystals. This would result in a change in the grain boundaries and the size and shape of any voids and lead to hysteretic effects (non-reproducibility). The composite properties of the material would change accordingly. Certainly, the magnetic, thermal and electric properties of monocrystals can be more accurately measured and more repeatedly relied upon than polycrystalline materials.

Cubic spinel crystals such as the crystals of the present invention, provide isotropic properties when compared to crystals of other geometric configurations. For example, transport processes, such as electric conductivity, are isotropic.

Polycrystals of nickel-manganese-oxides and manganese-cobalt oxides have been reported by a number of investigators and, in particular D. G. Wickham, et al. [1-3], and their properties have been studied and documented. Dr. Wickham's work, along with his collaborators, illustrated and characterized many of the advantageous properties of these polycrystalline cubic spinels. The use of a boron/bismuth flux for the growth of nickel manganite single crystals is disclosed in H. Makram, "Growth of Nickel Manganite Single Crystals," *Journal of Crystal Growth*, (1967), 325–366. The manufacture of single crystals of $NiMn_2O_4$ and their use as thermistors is disclosed in Rosen et al., U.S. application Ser. No. 485,851, filed on Jun. 7, 1995, which has received a notice of allowability.

Polycrystals of nickel-cobalt-manganese were reported by, for example, L. V. Azaroff, see Z. Kristallogr., volume 112, pages 33–43, (1959). However, monocrystals of these materials are believed to be unknown. Moreover, despite the success the inventors achieved throughout the growth of nickel- manganese oxide monocrystals, there was no way to predict how the introduction of an additional variable to the system (namely cobalt) would affect the ability to produce monocrystals. Particularly, there was no way to predict that the result would be the uniform production of a single phase nickel-cobalt-manganese oxide having a cubic-spinel structure.

SUMMARY OF THE INVENTION

The present invention provides monocrystalline nickel-cobalt-manganese oxide having a cubic spinel structure. In particular, the present invention provides such crystals over a full cubic spinel range of manganese/cobalt/nickel ratios and lattice parameters. Monocrystals of nickel-cobalt-manganese oxide are provided having a cubic spinel structure and an atomic ratio R [R=Mn/(Mn+Ni+Co)] which ranges from between about 0.1 to about 0.8 for manganese. These nickel-cobalt-manganese oxide monocrystals have a cubic spinel structure and a lattice parameter which ranges from between about 8.1 to about 8.45 Angstroms.

In other aspects of the present invention, there are also provided a number of methods of producing nickel-cobalt-manganese oxide monocrystals along the entire possible range of manganese to nickel ratios, provided that the resulting crystal has a cubic spinel structure.

The present invention also provides various methods of producing cubic spinel monocrystals of nickel-cobalt-manganese oxide from known or determined amounts of starting materials. It is also possible to predict the physical properties of the resulting monocrystal based on the proportion of $Mn_2O_3$, NiO and CoO in the initial melt.

Finally, in accordance with the present invention unique and advantageous sensors using a crystal or a portion of a nickel-cobalt-manganese oxide monocrystal having a cubic spinel structure as described herein are provided. Various devices which use such sensors and methods of their use are also contemplated.

By use of the present invention, one is able to produce, with a high degree of accuracy and precision, monocrystals of nickel-cobalt-manganese oxide having a cubic spinel structure and very advantageous and useful electrical properties. Because the resulting crystals are monocrystals, they do not suffer from many of the limitations and disadvantages of polycrystalline or ceramic materials, even those made from the same elements. Moreover, by the practice of the present invention, one is able to produce crystals over a broad range of manganese to nickel to cobalt ratios.

The relationship between the starting materials useful for producing nickel-cobalt-manganese oxide monocrystals and the actual crystals that will result has been determined. Therefore, it is now possible to preselect a crystal based on one of its advantageous physical properties and/or the desired ratio of component elements and, with a high degree of accuracy, produce crystals having that physical property or ratio of elements.

It is also possible, in accordance with the present invention, to provide highly accurate temperature sensors or thermistors which provide significant advantages such as a high sensitivity, good reproducibility and better aging characteristics.

BRIEF DESCRIPTION OF THE DRAWINGS

FIG. 8a is a plot of Dielectric Constant $(K=\epsilon/\epsilon_0)$ and Electric Conductivity (σ) [mho-m$^{-1}$] versus log Frequency [Hertz] for the monocrystal at −4° C.

BEST MODE OF CARRYING OUT THE INVENTION

Figure 1:
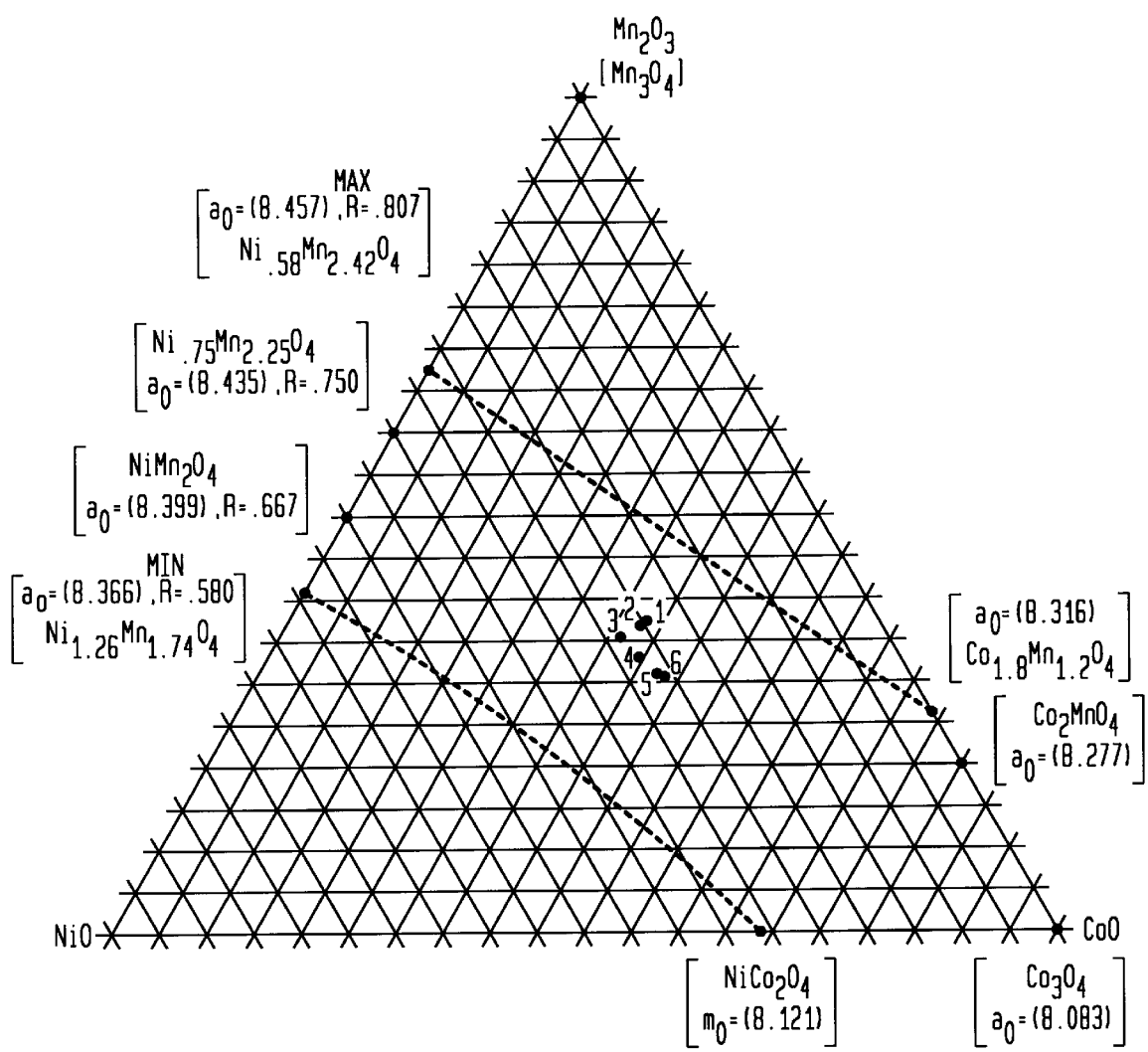
FIG. 1 is a composition diagram for the system NiO, CoO and $Mn_2O_3$.

In accordance with one aspect of the present invention, nickel, cobalt and manganese oxides are charged, along with a $Bi_2O_3/B_2O_3$ flux into a platinum crucible. To the best of the inventor's knowledge, this flux has never been suggested for use in a ternary metal oxide system or, indeed, a system using cobalt. The bismuth and boron oxides are collectively referred to herein as the flux. The crucible and its contents are then placed into a furnace, preferably one including a carousel or other device to insure that each crucible receives the same thermal treatment, and the mixture is heated to a specific melt temperature. The mixture is then held at that melt temperature, also referred to herein as the first temperature, for a period of time sufficient to form a complete solution of the starting materials. Ideally, particles which can act as seeds for uncontrolled crystal growth are eliminated. This is often termed "soaking." Soaking is generally carried out for a period of from between about 6 and about 100 hours. When soaking has been completed, the material is gradually cooled to a second elevated temperature during which time crystal development and growth occurs. Within reason, the more gradual the cooling rate, the larger the resulting crystals. Finally, when the second elevated temperature has been obtained, the contents of the crucible are removed from the oven and quickly quenched to bring the material down to room temperature. Thereafter, the crystals are separated from the bismuth/boron oxide flux, cleaned, inspected and used or stored.

The amounts of nickel oxide, manganese oxide, cobalt oxide, bismuth oxide and boron oxide useful in accordance with the present invention may vary depending upon a number of factors, including the size of the crystals, the desired ratio of manganese to nickel to cobalt, the size of the production run and the like. However, the ratio of nickel oxide, cobalt oxide and manganese oxide in the starting melt and the relationship between the ratio of these ingredients in the starting melt and the resulting ratio of manganese, cobalt and nickel in the resulting cubic spinel monocrystals are critical.

The amount of flux is not critical to the invention. The amount of flux must be sufficient to dissolve the other ingredients, and should be sufficient to allow for good homogenous mixing of all of the chemical species. Sufficient flux should also be provided so as to assure complete solution at the top temperatures used. To accomplish this, at least about 60 Mol % of flux should be provided. Similarly, the melt should not be too dilute.

$B_2O_3$ in the flux may range from between about 5 Mol % to about 50 Mol %, and more preferably from about 15 Mol % to about 25 Mol % of the flux. There is a eutectic at about 19–20 Mol % $B_2O_3$ of 622° C.[5]. This provides a good flux because it provides a low melting point and a wide temperature range through which crystals may grow.

Melt temperature is an important consideration in accordance with the present invention. A preferred flux in accordance with the present invention has a eutectic temperature of about 622° C. The $Mn_2O_3$ has a melting point of about 1705° C. in air. Nickel oxide and cobalt oxide have melting points of almost 2000° C. The boron/bismuth oxide flux acts upon the nickel oxide, cobalt oxide, and $Mn_2O_3$ to depress their melting points and to effect their dissolution.

Both the first elevated temperature (the highest temperature of the system, (also referred to herein as the "top temperature" or "$T_t$") and the second elevated temperature (the temperature at which quenching begins also known as the "quenching temperature" or "$T_q$") are extremely important to the growth of crystals. The top temperature must be high enough to dissolve all the components. However, the temperature cannot be so high that, for example, the boron oxide and the bismuth oxide become volatile and some are lost by evaporation.

The melt used in a preferred aspect of the present invention had a top temperature of 1280° C. However, that temperature is by no means the upper limit for the first elevated temperature. In fact, any temperature which is suitable for a given flux and which causes the dissolution of all of the components while, at the same time, providing a relatively stable system may be utilized. In the $B_2O_3/Bi_2O_3$ system, top temperatures will be limited by the volatility of the $B_2O_3$ and $Bi_2O_3$ which vary with the composition of the melt. However, temperatures in excess of 1300° C. may be applicable for a bismuth oxide and boron oxide flux. In accordance with the present invention, this first elevated temperature will preferably range from between about 1250° C. to about 1350° C. and preferably from between about 1260° C. to about 1300° C.

In running a number of tests, the inventors found that a second elevated temperature, "$T_q$" of 860° C. was acceptable.

Crystal growth occurs during the cooling from the top temperature or first elevated temperature to the quench temperature or second elevated temperature. If the ratios of ingredients and the temperatures are correct, then, cubic spinel, single crystals of nickel-cobalt-manganese oxide will result. In general, the longer that the material is allowed to cool to the quenching temperature the better. For example, a cooling rate of approximately 0.6° C. per hour from 1280° C. to 860° C. has been used successfully. However, to promote the growth of even larger crystals, it may be desirable to decrease the cooling rate and/or extend the cooling time. Alternatively and/or in addition thereto, the top temperature and quenching temperatures may be adjusted to provide a longer cooling period. In general, the cooling rate should range from between about 0.3 to about 5° C./hour and preferably between about 0.6 and about 1.0° C./hours.

Quenching involves rapidly lowering the temperature so as to stop crystal formation in such a way that only the crystals of the desirable structure result. Quenching under a blanket of, for example an anhydrous and inert gas is highly preferable. When successful, the present invention includes black crystals which may be freed from the bulk of the flux by any known means. One way to accomplish extraction is to use acids such as 10 Vol % nitric acid or 10–20 Vol % acetic acid to dissolve the flux.

Having determined the interrelationship between the ratio of the starting melt materials and the ratio of nickel, cobalt and manganese in the resulting crystals allows one to tailor make cubic spinel crystals of nickel-cobalt-manganese oxide of any desired nickel to cobalt to manganese ratios (within the boundary conditions of a cubic spinel structure as illustrated in FIG. 1) by varying the amounts of starting materials as indicated below in Tables 1 and 2. The relationship between melt composition and crystal composition is shown in FIG. 2.

TABLE 1

Figure 2:
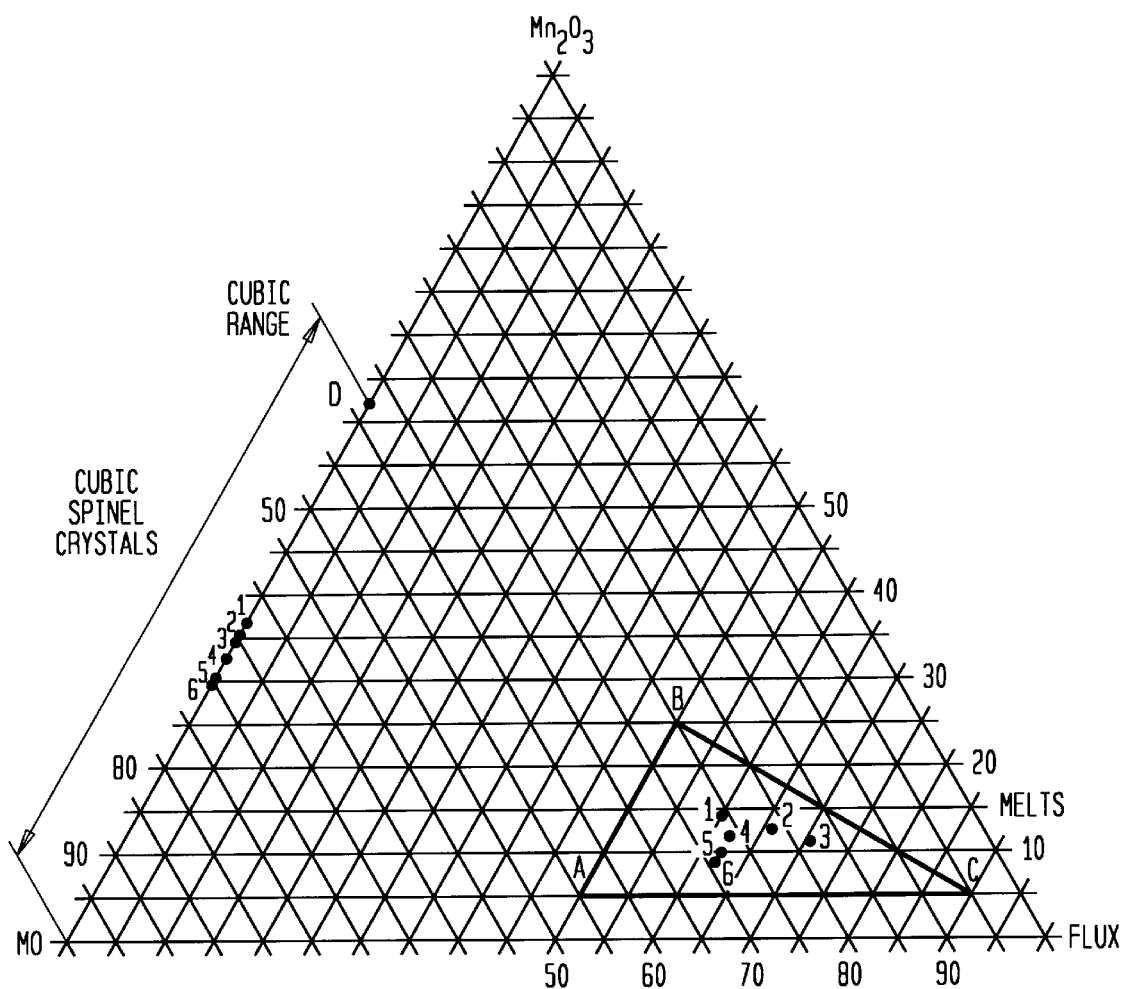
FIG. 2 is a composition diagram for the MO—$Mn_2O_3$—Flux system. "MO" is equal to the sum of the NiO and CoO components in the system.

Initial Composition of Melt within Area ABC Defined by Points (A, B, C) in Figure 2 given in mole percent.

| Melt (m/o)* Points | Flux | $Mn_2O_3$ | MO** | Range for MO** |
|---|---|---|---|---|
| | | | | MO = (CoO) + (NiO) |
| A | 50 | 5 | 45 | 45 = (40) + (5) |
| | | | | 45 = (44) + (1) |
| B | 50 | 25 | 25 | 25 = (24) + (1) |
| | | | | 25 = (1) + (24) |
| C | 90 | 5 | 5 | 5 = (4) + (1) |
| | | | | 5 = (1) + (4) |

*m/o = mole percent
**MO = NiO + CoO

TABLE 2

Composition Limits of a Cubic Spinel Crystal Defined Along the Line Bounded by Points (MO, D) in Figure 2 given in mole percent.

| Crystal Composition (m/o)* Points | NiO | CoO | MO | $Mn_2O_3$ | Flux | $a_o$(A) | R |
|---|---|---|---|---|---|---|---|
| MO | 0 | 100 | 100 | 0 | 0 | 8.1 | 0.1 |
| D | 32.4 | 0 | 32.4 | 67.6 | 0 | 8.5 | 0.8 |

*m/o = mole percent
**MO = NiO + CoO

Figure 3:
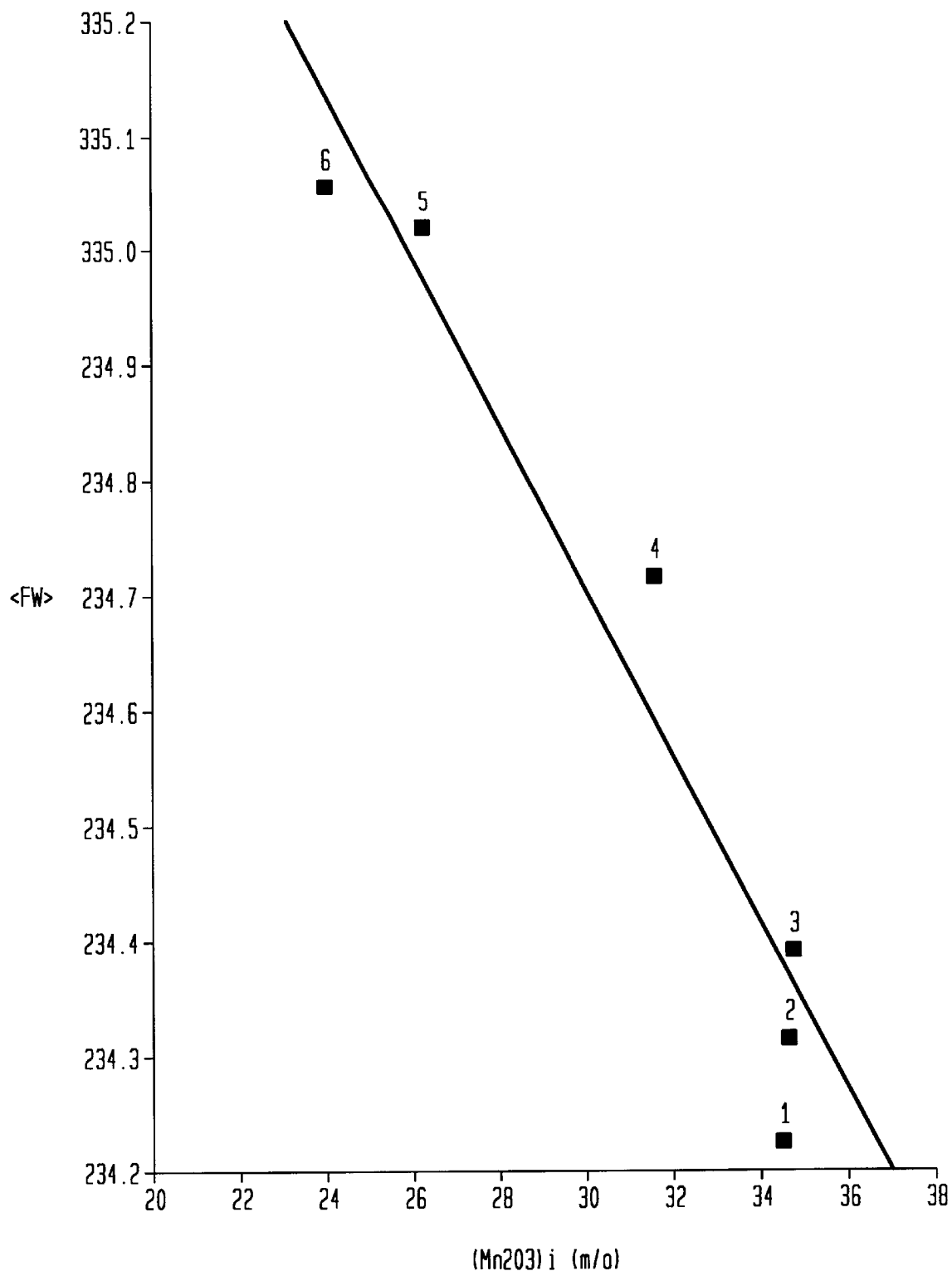
FIG. 3 is a plot of the average formula weight <FW> of the crystal versus the initial $(Mn_2O_3)_i$ with respect to the solute.

FIG. 3 is a linear plot of the average formula weight of $M_3O_4$ of the cubic spinel monocrystal $Ni_xCo_yMn_zO_4$ versus initial manganese oxide concentration in the melt $(Mn_2O_3)_i$ with respect to solute. These figures demonstrate that a nearly stoichiometric relationship exists between the ratio of starting materials and the ratio of elements in the resulting monocrystal.

Figure 4:
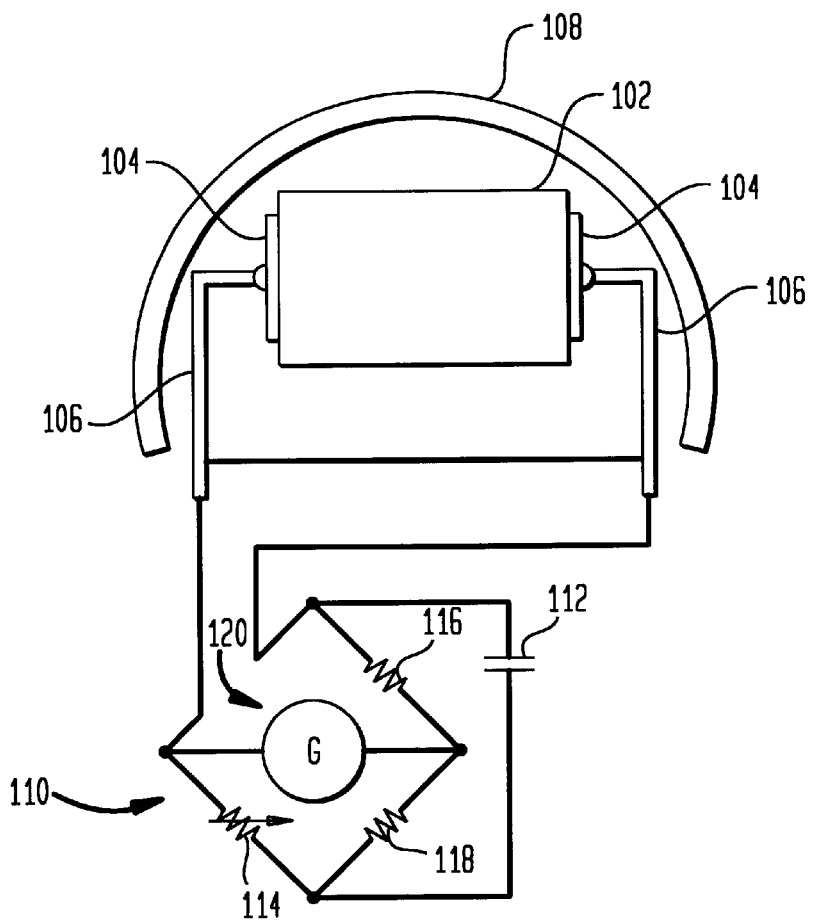
FIG. 4 is a diagrammatic view depicting a sensor in accordance with an embodiment of the invention.

A sensor or thermistor in accordance with a further embodiment of the invention includes a sensing element 102 (FIG. 4) consisting of a monocrystalline nickel-cobalt-manganese oxide spinel made in accordance with the above-described embodiments of the invention, and a pair of electrical terminals 104 in substantially ohmic contact with the sensing element. Terminals 104 can be formed from noble metals and their alloys, copper, and aluminum and their alloys. Platinum, palladium and gold, and their alloys are particularly preferred. The metallic terminals can be applied by sputtering the metal of the terminal onto the spinel, or by electroplating, electroless plating, painting with a metallic paint or pressurized contact so that the metal of the terminal is in intimate contact with the spinel. Leads 106 are connected to the terminals by welding or soldering. Sensing element 102, contacts 104 and leads 106 are enclosed in a conventional housing 108, of which only a portion is illustrated in FIG. 4.

Figure 5:
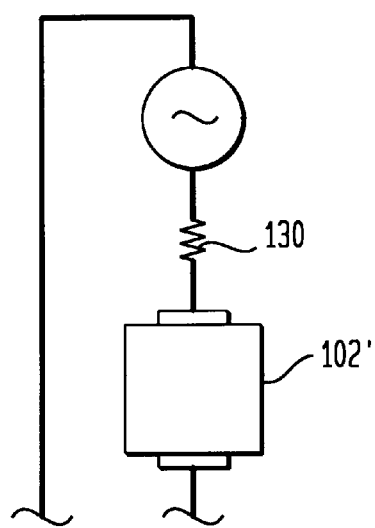
FIG. 5 is a diagrammatic view depicting an electrical circuit in accordance with the invention.

Leads 106, and hence the sensing element, are connected to an electrical resistance measuring device 110 adapted to measure the electrical resistance through the sensing element. The particular resistance-measuring device illustrated in FIGS. 4–5 is a Wheatstone bridge, incorporating a battery 112; a variable resistor 114 in series with the sensing element to form one branch; resistors 116 and 118 connected in series with one another to form another branch in parallel with the first branch and a galvanometer 120 connected between the branches. The circuit can be used to measure an unknown temperature by exposing the housing 108, and hence sensing element 102, to the unknown temperature, and adjusting resistor 114 until the bridge is in balance, whereupon galvanometer 120 shows no current flow. The resistance required to bring the bridge into balance is a measure of the resistance through the sensing element, and hence a measure of the unknown temperature. Many other conventional resistance-measuring instruments can be used in place of the Wheatstone bridge. For example, a conventional ohmmeter can be employed.

The sensing element can also be used to provide temperature compensation in an electrical circuit. For example, an electronic circuit may include resistor 130 connected in series with sensing element 102' similar to the sensing element discussed above, and further connected to other circuit components (not shown). When the circuit is exposed to changes in ambient temperature, the resistance of resistor 130 tends to increase with increasing temperature. The decrease in resistance of sensing element 106' compensates for such increase. The variation in impedance of the sensing element with temperature can be used to compensate for changes in properties of other electronic components, such as semiconductors devices, capacitors, inductors and the like. Sensing elements according to this aspect of the invention are particularly useful in circuits driven with alternating currents above about 10 Hz, and even more useful at higher frequencies. In contrast to polycrystalline sensors, the sensors according to this aspect of the invention have substantially lower dispersion or change in impedance with frequency than polycrystalline sensing elements. Thermistors can operate between at least –63 to 260° C., see generally the 1993 Thermometrics' Catalog, entitled "Worldwide Capability in Thermistors". A wider range will be available with doping.

The foregoing will be better understood with reference to the following examples. All references made to these examples are for the purposes of illustration. They are not to be considered limiting as to the scope and nature of the present invention.

EXAMPLE I

Monocrystals of nickel-cobalt-manganese oxide having a cubic spinel structure were grown in solutions of molten mixtures of bismuth and boron oxides (flux) as follows.

For each of the compositions 1 through 6, the following protocol was used. Into six 50 ml platinum crucibles appropriate amounts of NiO, $Co_3O_4$, $Mn_2O_3$, $B_2O_3$ and $Bi_2O_3$ were charged. The quantities of oxides to be weighed into these crucibles is given in Table 3 for a total charge of 0.6 moles. The composition in terms of mole percent (m/o) of oxide is given in Table 4.

TABLE 3

ACTUAL WEIGHTS OF STARTING MATERIALS FOR 0.6 MOLES

| Material | $Co_3O_4$ [gms] | NiO [gms] | $Mn_2O_3$ [gms] | $B_2O_3$ [gms] | $Bi_2O_3$ [gms] |
|---|---|---|---|---|---|
| 1 | 8.139 | 4.109 | 13.195 | 4.762 | 135.874 |
| 2 | 6.916 | 3.491 | 11.215 | 5.238 | 149.461 |
| 3 | 6.102 | 3.083 | 9.899 | 5.556 | 158.519 |
| 4 | 7.706 | 4.481 | 11.367 | 4.921 | 140.403 |
| 5 | 8.669 | 4.481 | 9.472 | 4.921 | 140.403 |
| 6 | 8.909 | 4.705 | 8.525 | 4.921 | 140.403 |

TABLE 4

STARTING MATERIALS AS MOLE PERCENT (M/O)

Initial (m/o)

| Crucible No. | $(CoO)_i$* | $(NiO)_i$ | $(MO)_i = CoO + NiO)_i$ | $(Mn_2O_3)_i$ | $(Mn_2O_3/MO)_i$ | Flux** $(B_2O_3 + Bi_2O_3)$ |
|---|---|---|---|---|---|---|
| 1 | 16.90 | 9.17 | 26.07 | 13.93 | 0.5343 | 60 = 11.40 + 48.60 |
| 2 | 14.36 | 7.79 | 22.15 | 11.84 | 0.5345 | 66 = 12.54 + 53.46 |
| 3 | 12.67 | 6.88 | 19.55 | 10.45 | 0.5345 | 70 = 13.30 + 56.70 |
| 4 | 16.00 | 10.00 | 26.00 | 12.00 | 0.4615 | 62 = 11.78 + 50.22 |
| 5 | 18.00 | 10.00 | 28.00 | 10.00 | 0.3571 | 62 = 11.78 + 50.22 |

TABLE 4-continued

STARTING MATERIALS AS MOLE PERCENT (M/O)

Initial (m/o)

| Crucible No. | $(CoO)_i$* | $(NiO)i$ | $(MO)_i = CoO + NiO)i$ | $(Mn_2O_3)_i$ | $(Mn_2O_3/MO)_i$ | Flux** $(B_2O_3 + Bi_2O_3)$ |
|---|---|---|---|---|---|---|
| 6 | 18.50 | 10.50 | 29.00 | 9.00 | 0.3103 | 62 = 11.78 + 50.22 |

*For example in No. 5, if $(CoO)i = 18.00$ (m/o), then one $(Co_3O_4)i$ is equivalent to three (CoO).
**Flux = [(19:81) m/o = $B_2O_3$:$Bi_2O_3$] relative to solvent only.
Presented in table as Flux relative to (solvent plus solute).
Atomic Weights: O = 15.9994, Co = 58.93320, Ni = 58.69, Mn = 54.93805, B = 10.811, Bi = 208.98037
Formula Weights: CoO = 74.93260, $Co_3O_4$ = 240.79720, NiO = 74.6894, $Mn_2O_3$ = 157.87430, $B_2O_3$ = 69.6202, $Bi_2O_3$ = 465.95894

Compositions are computed for the cobalt oxide (CoO) but were weighed out as $Co_3O_4$, the commercially available material. The six crucibles were positioned inside a six-inch diameter, six-inch high platinum crucible, and held in place by an alumina form. This platinum container was loosely covered by a platinum lid in order to prevent contamination. The lid was mounted in such a manner so that the equilibrium between the samples and the oxygen in the air was maintained. This covered container, along with its contents, was placed into a furnace and positioned onto a pedestal programmed to rotate clockwise and counter-clockwise to ensure mixing and equal thermal treatment for all six charged crucibles. The furnace was then heated to a top temperature of 1280° C. The crucibles were then soaked at that temperature for 60 hours. After soaking the crucibles were cooled to a second elevated temperature, of 860° C. at a rate of −0.6° C. per hour.

At the second elevated temperature, the contents of crucibles 1 through 6 contained crystals surrounded by liquid. When Tq was attained, the crucibles were quenched under a blanket of dry nitrogen gas to ambient temperature.

The contents of crucibles 1 through 6 were cored at their centers, producing a shallow cylindrical hole approximately 2 cm long and 1 cm in diameter. The cores and the cored crucibles were immersed in 10 volume percent acetic acid. The residual sludge was washed away and the crystals, traceable to their respective crucibles, were recovered.

The crystals obtained from each of the six crucibles were studied by X-ray diffraction and chemically analyzed for nickel, cobalt, and manganese content. See FIGS. 1 and 2. The cubic spinel lattice constants, chemical composition, and X-ray densities are presented in Table 5. The resulting crystals ranged in size from 0.4 to 1 cm along an edge.

TABLE 5

LATTICE CONSTANT DATA AND CHEMICAL COMPOSITION DATA ALONG WITH THE CALCULATED X-RAY DENSITY (D) OF TERNARY CUBIC SPINEL MONOCRYSTALS OBTAINED FROM FLUX GROWTH METHOD

| Crucible -Specimen # | Lattice Constant $a_o$ (Å) | Chemical Composition $Ni_xCo_yMn_zO_4 = M_3O_4$ | | | X-ray Density D [g/cm³] |
|---|---|---|---|---|---|
| | | x | y | z | |
| 1 - 1 | 8.3656 | 0.5072 | 0.8572 | 1.6356 | 5.3120 |
| 1 - 2 | 8.3696 | 0.5393 | 0.8301 | 1.6307 | 5.3048 |
| 1 - 3 | 8.3707 | 0.5249 | 0.8243 | 1.6509 | 5.3010 |
| 1 - 4 | 8.3427 | 0.5667 | 0.9093 | 1.5241 | 5.3667 |
| X̄ | <8.3622> | <0.5345> | <0.8552> | <1.6103> | <5.3211> |
| 2 | 8.3376 | 0.5765 | 0.8374 | 1.5861 | 5.3708 |

TABLE 5-continued

LATTICE CONSTANT DATA AND CHEMICAL COMPOSITION DATA ALONG WITH THE CALCULATED X-RAY DENSITY (D) OF TERNARY CUBIC SPINEL MONOCRYSTALS OBTAINED FROM FLUX GROWTH METHOD

| Crucible -Specimen # | Lattice Constant $a_o$ (Å) | Chemical Composition $Ni_xCo_yMn_zO_4 = M_3O_4$ | | | X-ray Density D [g/cm³] |
|---|---|---|---|---|---|
| | | x | y | z | |
| 3 | 8.3347 | 0.6120 | 0.8208 | 1.5672 | 5.3779 |
| 4 - 1 | 8.3658 | 0.6712 | 0.9392 | 1.3896 | 5.3339 |
| 4 - 2 | 8.3667 | 0.6190 | 0.8704 | 1.5105 | 5.3214 |
| 4 - 3 | 8.3364 | 0.6031 | 0.8601 | 1.5369 | 5.3775 |
| X̄ | <8.3563> | <0.6311> | <0.8899> | <1.4790> | <5.3443> |
| 5 - 1 | 8.3381 | 0.5916 | 0.9942 | 1.4143 | 5.3845 |
| 6 - 1 | 8.3243 | 0.5939 | 1.0042 | 1.4019 | 5.4125 |
| 6 - 2 | 8.3247 | 0.6014 | 0.9842 | 1.4144 | 5.4105 |
| 6 - 3 | 8.3265 | 0.5982 | 1.0359 | 1.3660 | 5.4124 |
| X̄ | <8.3252> | <0.5978> | <1.0081> | <1.3941> | <5.4118> |

The compositions calculated in terms of the individual oxides are given in Table 6 and plotted in FIG. 2. The average formula weights of the crystals taken from crucibles 1–6 are plotted against their initial $(Mn_2O_3)_i$ concentration with respect to the solute in FIG. 3.

TABLE 6

AVERAGE VALUES OF FORMULA WEIGHT <FW> OF THE TERNARY CUBIC SPINEL CRYSTALS WITH THE OXIDE VALUES IN MOLE PERCENT <M/O>$_f$ ALONG WITH THEIR STARTING MATERIALS IN MOLE PERCENT (M/O)$_i$ WITH RESPECT TO SOLUTE

| | Crucible | | | | | |
|---|---|---|---|---|---|---|
| Parameters | 1 | 2 | 3 | 4 | 5 | 6 |
| $(NiO)_i$ | 22.9250 | 22.9185 | 22.9333 | 26.3157 | 26.3157 | 27.6316 |
| $(CoO)_i$ | 42.2500 | 42.2477 | 42.2333 | 42.1053 | 47.3684 | 48.6842 |
| $(Mn_2O_3)_i$ | 34.8250 | 34.8338 | 34.8333 | 31.5789 | 26.3158 | 23.6842 |
| <NiO>$_f$ | 24.34 | 26.12 | 27.61 | 27.91 | 25.80 | 25.96 |
| <CoO>$_f$ | 38.96 | 37.94 | 37.03 | 39.35 | 43.36 | 43.77 |
| <$Mn_2O_3$>$_f$ | 36.70 | 35.93 | 35.35 | 32.74 | 30.85 | 30.27 |
| <FW>$_f$ | 234.24 | 234.32 | 234.39 | 234.73 | 235.01 | 235.08 |

EXAMPLE II

Sensors developed from the materials grown in the crucibles was used to determine the change in resistance of the material at various temperatures. Sensors were produced as follows. Monocrystals were recovered from the flux and cleaned. Electrical contact(s) were made by applying a dab of Dupont 4922N silver paint mixed with butyl acetate onto a face of a specimen, and drying this contact at 100° C. for 10 minutes. The contacts are cured at 200° C. for 1 hour. One mil Pt wires were then soldered on to the fired ink spots.

EXAMPLE III

Electric characteristics (expressed in mks units) of small thin plates (14×27×27 mils) cut from monocrystals grown in crucibles 1–6 and ceramic polycrystalline material of approximately the same composition as the monocrystals were analyzed with a Hewlett-Packard 4192A Impedance Analyzer. The polycrystals were obtained from Thermometrics, U.S. Highway 1, Edison, N.J., 08817 (lot No. 062292MP-1). The (27×27) faces were electroded with Dupont 4922N silver paint. The contacted chip was placed into a clip with two lead wires which were inserted into the test fixture of the Impedance Analyzer. Impedance-frequency spectra were obtained for sixty five frequencies ranging from 5 to $1.3 \times 10^7$ Hz interval at temperatures ranging from –69 to 204° C. The impedance analysis in terms of frequency (f) in Hertz, series resistance (Rs) and series capacitive reactance ($X_s$) was obtained. The ($R_s$,$X_s$) data can be converted to their parallel ($R_p$,$X_p$) equivalents. Several impedance related properties can be calculated such as resistivity (ρ) and capacitance.

See Impedance Spectroscopy, Edited by J. Ross Macdonald, John Wiley and Sons (1987) and especially chapters 1 and 4 thereof which are hereby incorporated by reference.

Figure 6A:
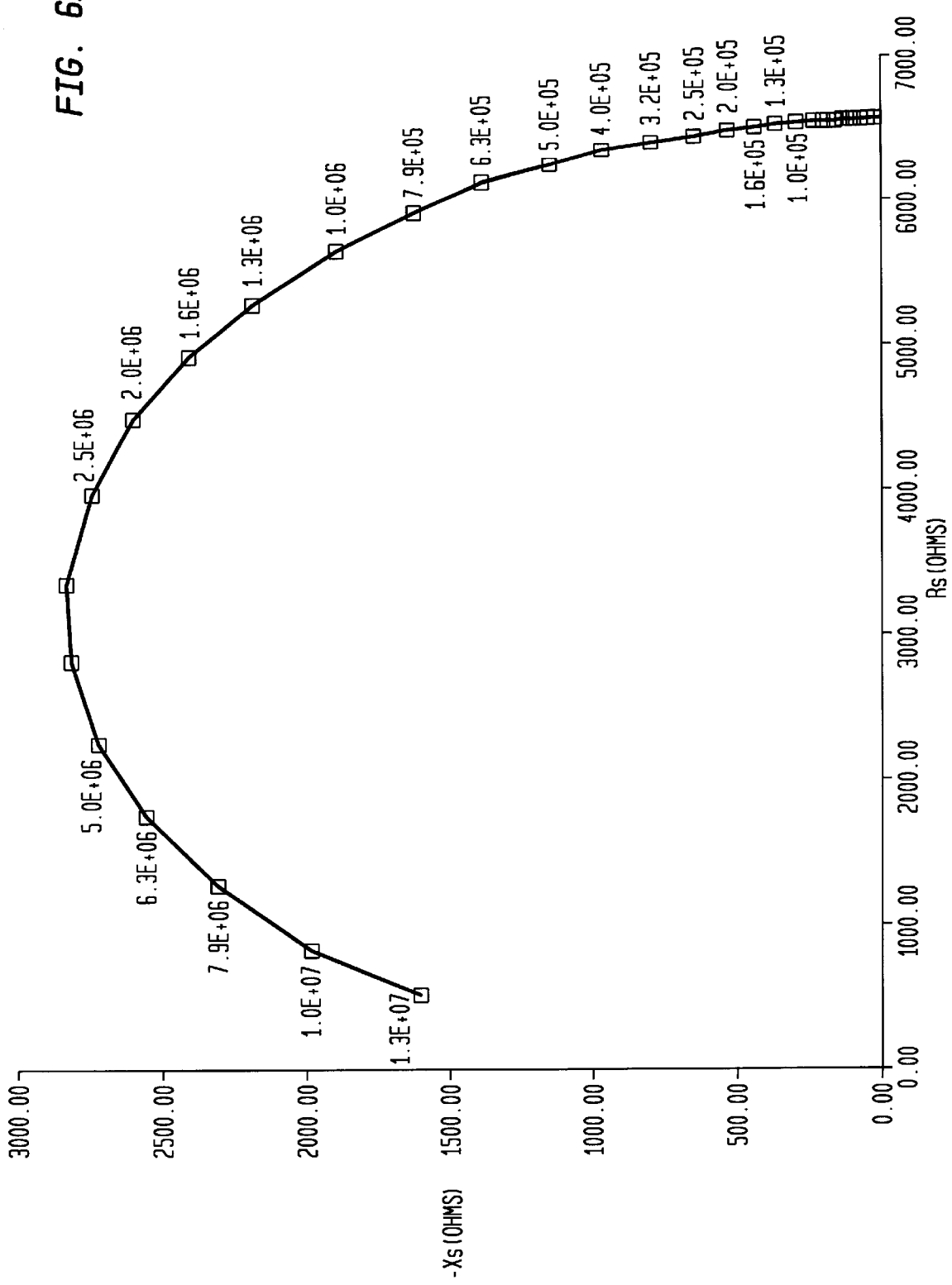
FIG. 6a is an impedance plot of $[-X_s$ versus $R_s]$ in ohms for the monocrystal at T=−4° C. over the frequency range f=5 Hz to $1.3 \times 10^7$ Hz.
Figure 6B:
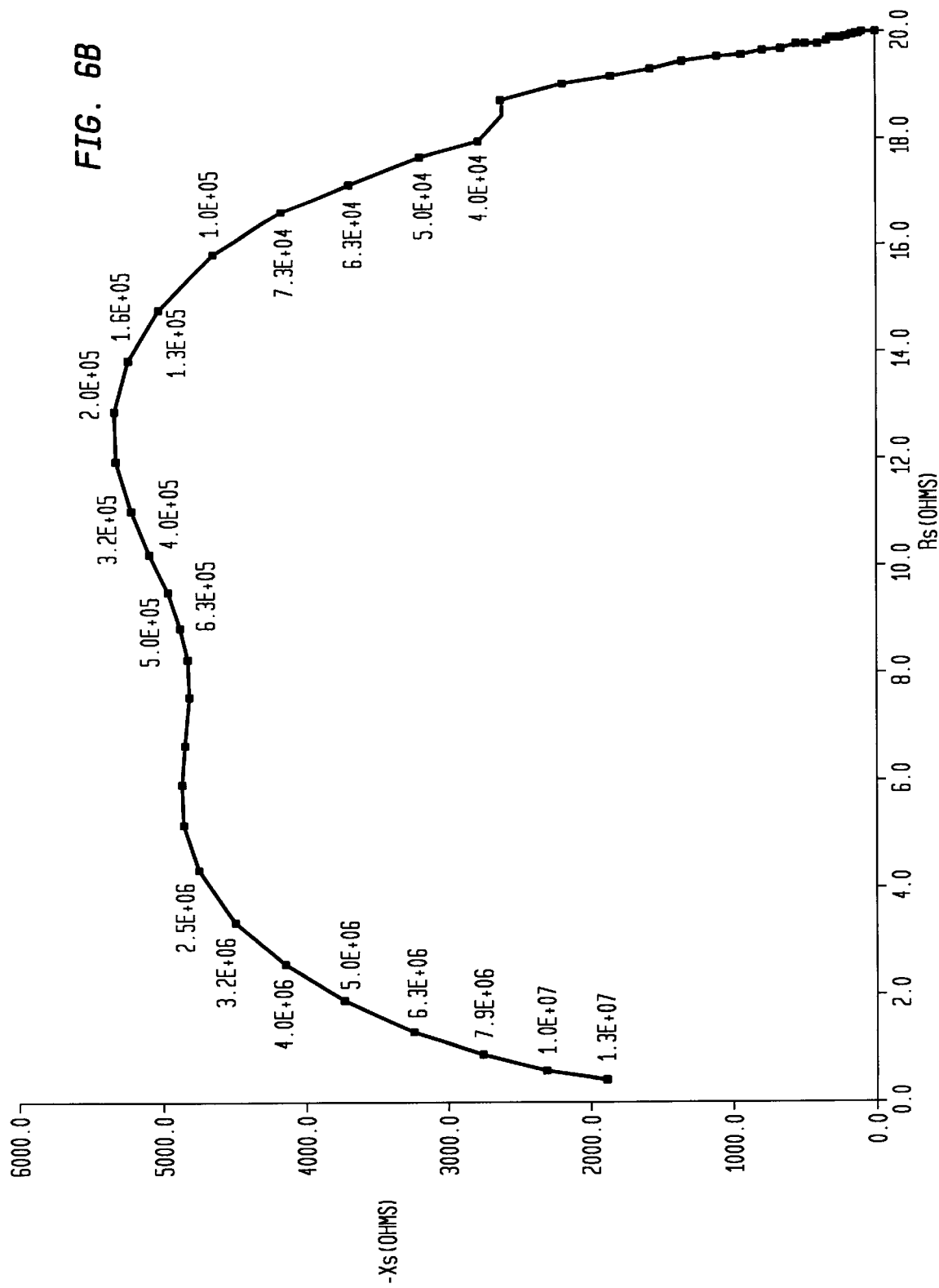
FIG. 6b is an impedance plot of $[-X_s$ versus $R_s]$ in ohms for the ceramic at T=−4° C. over the frequency range f=5 Hz to $1.3 \times 10^7$ Hz.

Impedance plane plots of the ($R_s$, $X_s$, f) data generated by the Hp4192A are shown for the –4° C. isotherms of a monocrystal slice taken from a monocrystal produced in crucible 3 and the ceramic identified above in FIGS. 6a and 6b, respectively. Sixty-five sets of (f, $R_s$, $X_s$) data were actually obtained for each isotherm.

Figure 7:
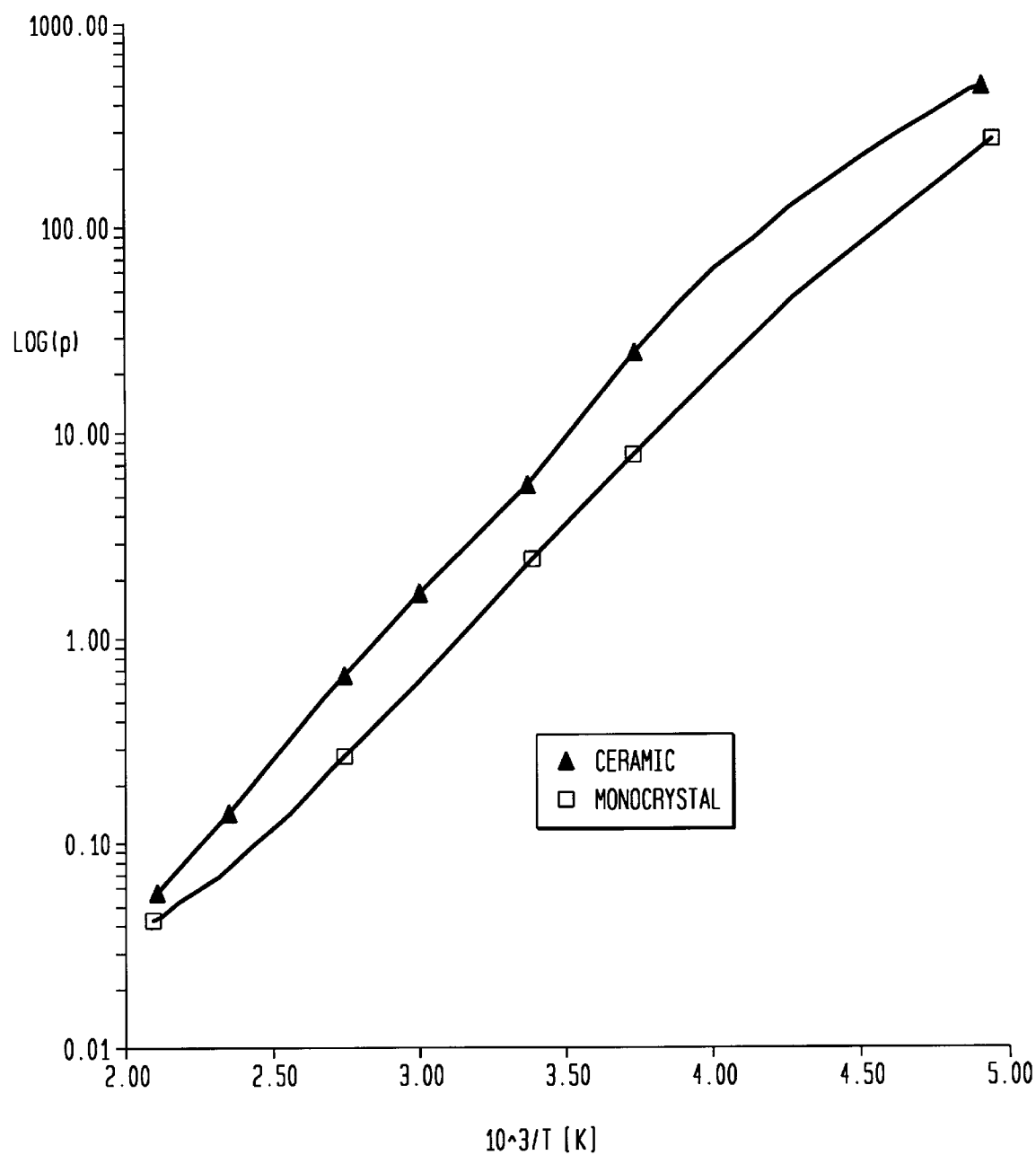
FIG. 7 is a semi-log plot of Resistivity ρ versus Inverse Temperature for a monocrystal and analogous ceramic at 5 Hz.
Figure 10:
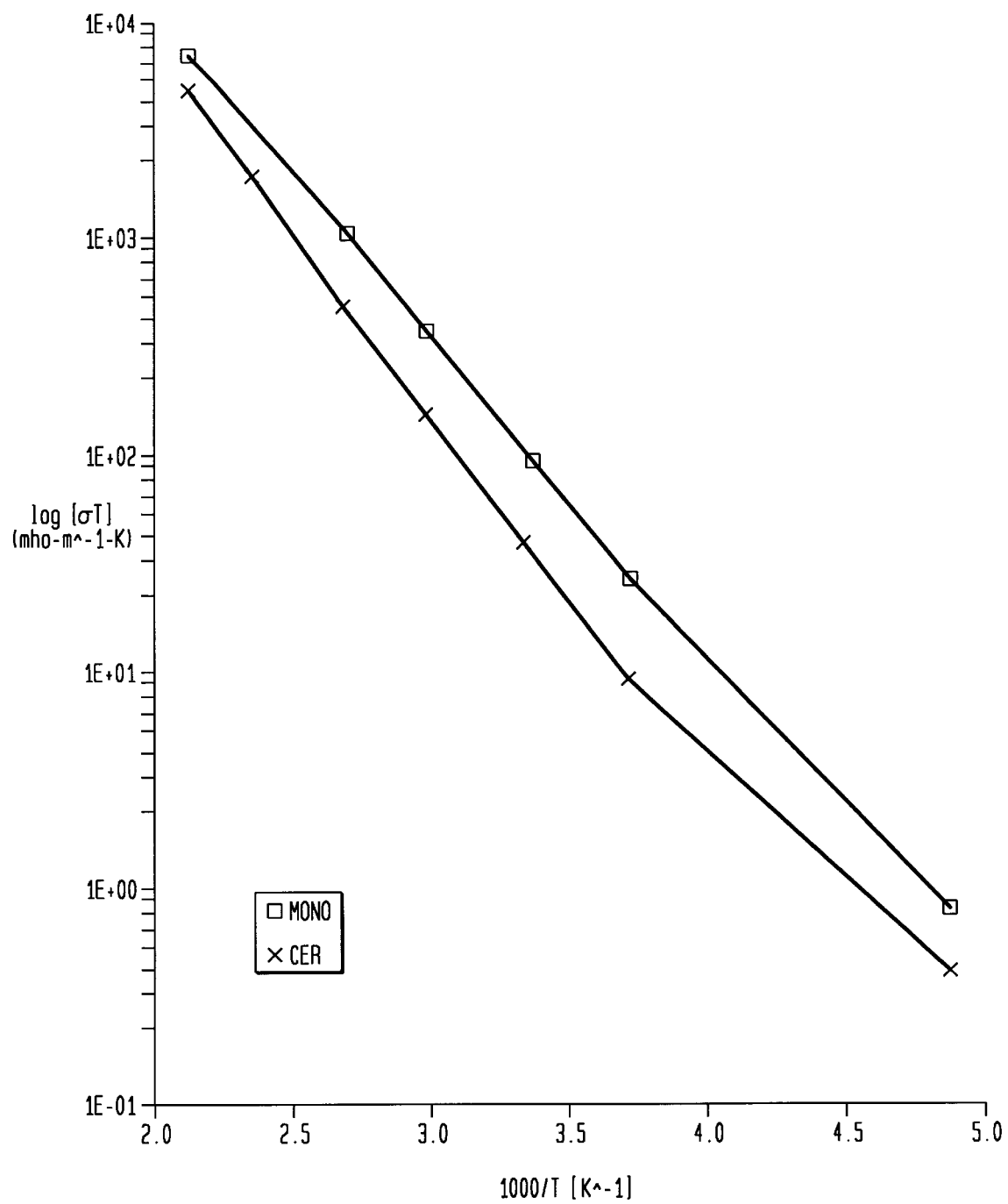
FIG. 10 are two semi-log plots of the product of [Conductivity and Temperature] versus [Inverse Temperature] for the monocrystal and ceramic taken at 5 Hertz.

FIG. 7 is a semi-log plot of resistivity (ρ) versus inverse temperature for both the monocrystal and the ceramic identified above. The change in the DC resistance of a material with temperature is a the property utilized by designers in developing thermistors. It is a logarithmic function described ideally by the equation:

$$\log \rho = E/2.303kT + A$$

where ρ is the resistivity, A is a numerical constant, k is Boltzmann's constant, T is the absolute temperature (° K) and E is the activation energy for conductivity, a characteristic related to material's composition. According to the equation, a plot of log ρ against the reciprocal temperature (T/T) should be a straight line with a slope (E/2.303k) which permits calculation of the activation energy. This slope describes the observed decrease of resistance with increasing temperature. Typical values for activation energy are 0.28 electron volts or the equivalent 3250° K. The greater the activation energy the greater the change of resistance with temperature. Imperfect materials, such as polycrystals, exhibit changes in E over narrow temperature ranges. See FIG. 10. A comparison of the plots illustrates that the monocrystal exhibits a more log-linear behavior then that exhibited by the ceramic. The low temperature region in particular shows a greater nonlinearity for the ceramic than for the monocrystal. The uniformity of the monocrystal means that thermistors produced therefrom can be calibrated from a single point rather then multiple points as would be required for thermistors made from a polycrystalline ceramic. Moreover, even with the increased calibration, the monocrystal would likely yield improved accuracy. This is a critical difference in the properties of these materials in terms of their intended use.

Figure 8B:
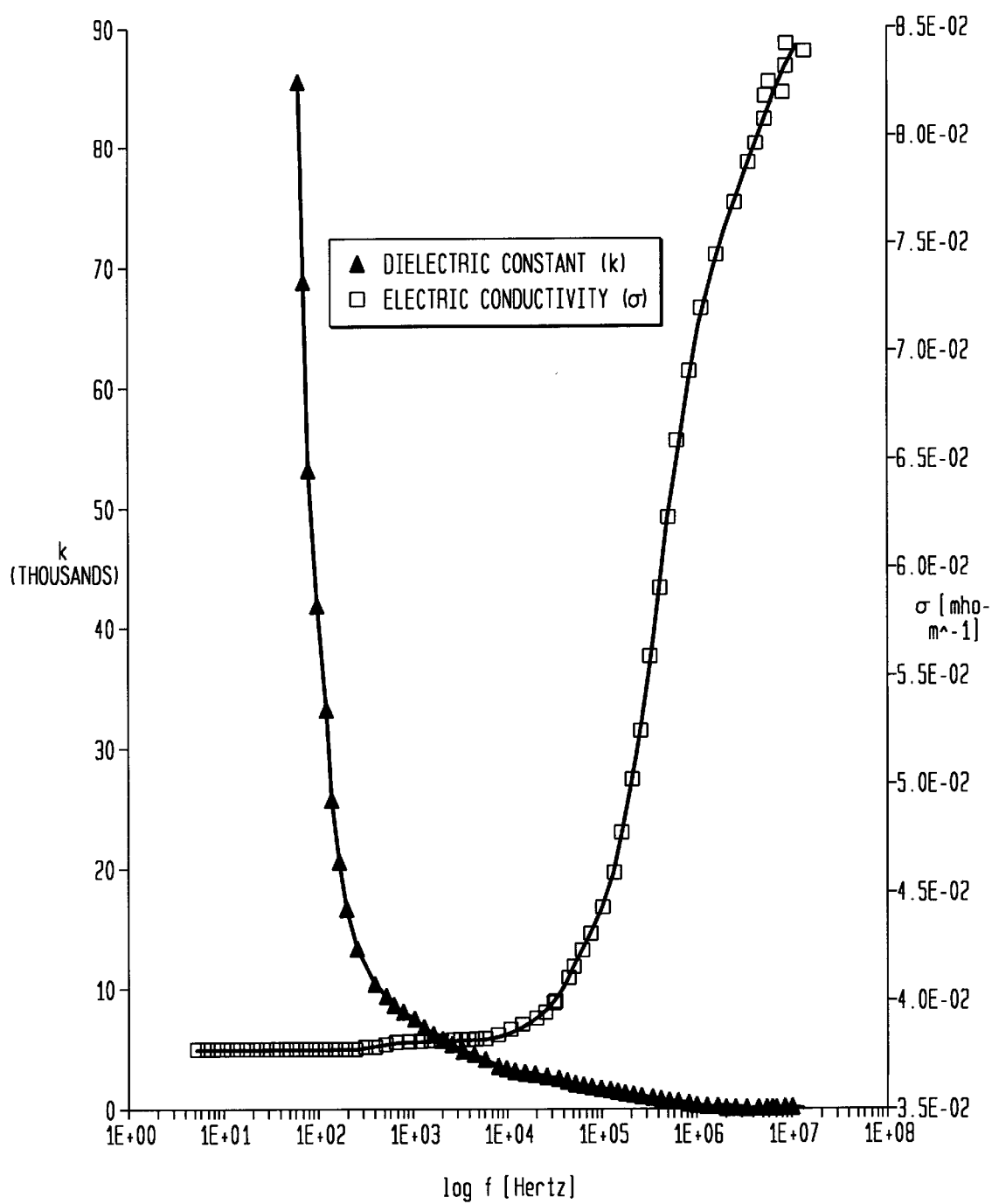
FIG. 8b is a plot of Dielectric Constant $(K=\epsilon/\epsilon_0)$ and Electric Conductivity (σ) [mho-m$^{-1}$] versus log Frequency [Hertz] for the ceramic at −4° C.

FIGS. 8a and 8b illustrate the behavior of the monocrystal and ceramic materials identified above, respectively, in terms of conductivity (Open Squares) and dielectric constant (Closed Triangles). As shown in FIG. 8a, the conductivity of the monocrystal is very constant between about 5 Hz (DC current) and about $1 \times 10^5$ Hz. In contrast, the ceramic shows a constant conductivity only to about $1 \times 10^3$ Hz. In addition, the conductivity of the monocrystal in general is higher then that of the polycrystal. This means that the monocrystal has a lower resistance, a fact which can be of great importance in making thermistors. Finally, the dielectric constant of the monocrystal appears of be linear and constant between about $1 \times 10^2$ and $1 \times 10^7$ Hz while the ceramic is constant only between about $1 \times 10^6$ and $1 \times 10^7$ Hz.

Figure 9A:
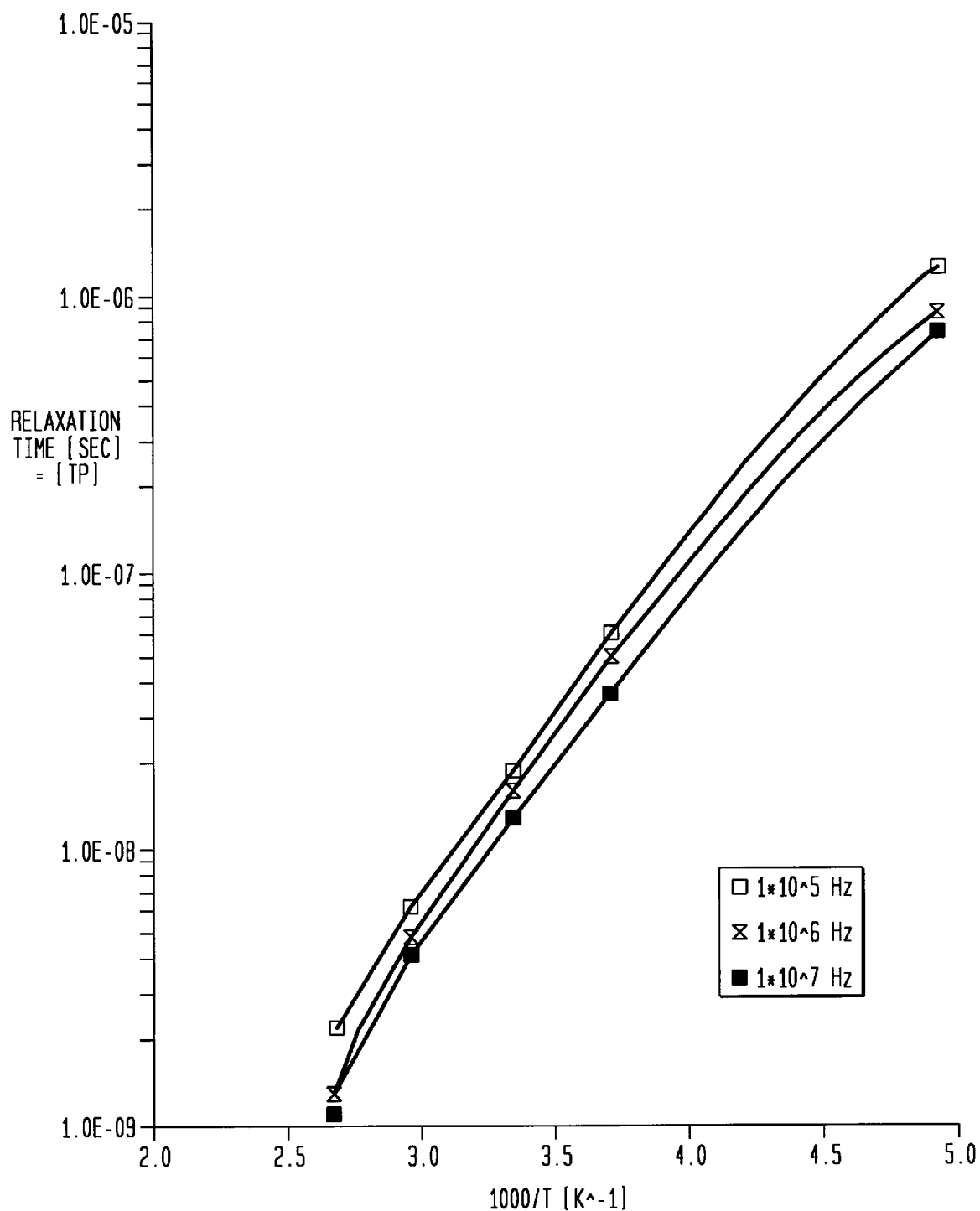
FIG. 9a are constant frequency semi-log plots of Relaxation Time $(\tau_p)$ versus Inverse Temperature for the monocrystal.
Figure 9B:
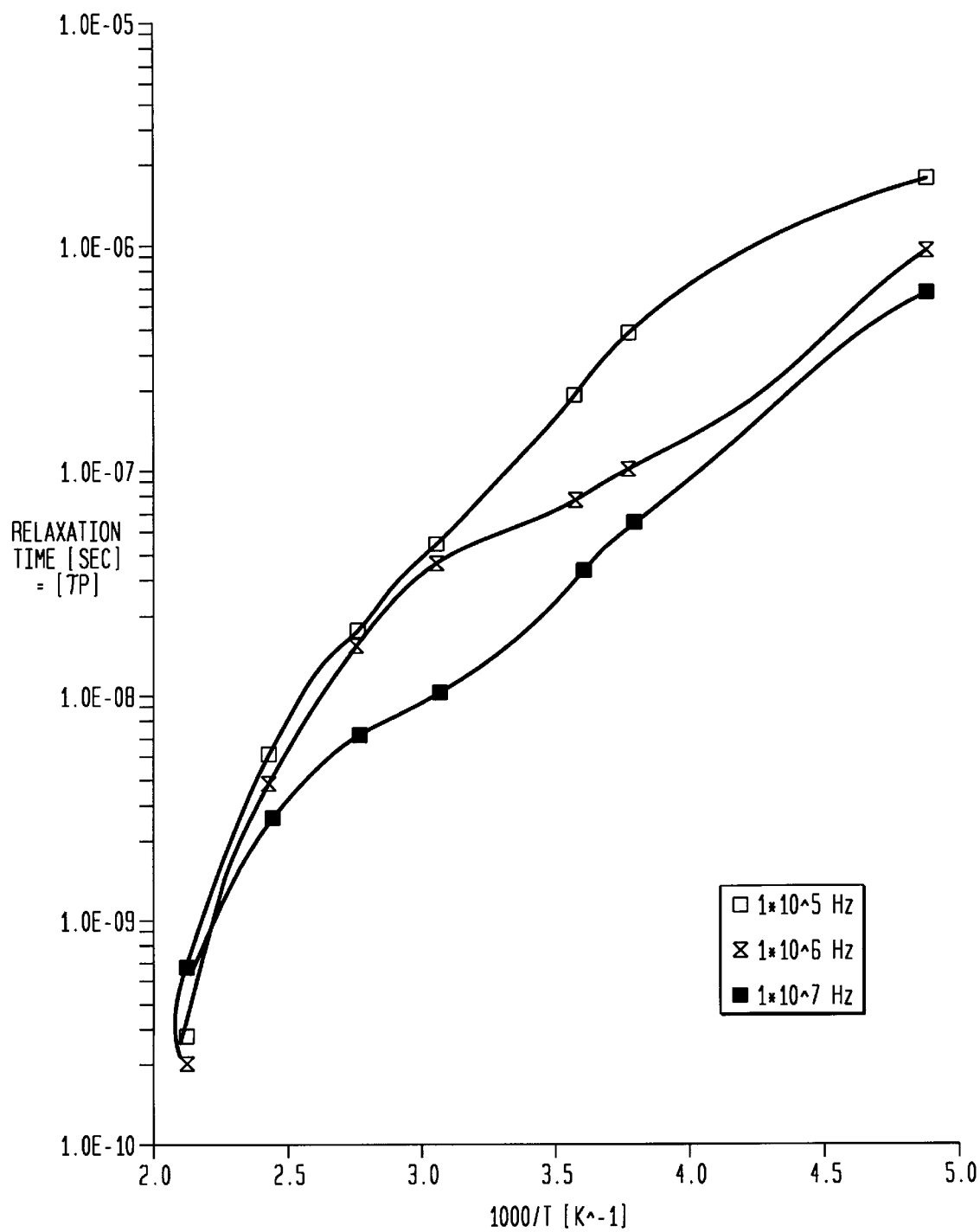
FIG. 9b are constant frequency semi-log plots of Relaxation Time $(\tau_p)$ versus Inverse Temperature for the ceramic.

FIGS. 9a and 9b are constant frequency plots of log $\tau_p$ versus inverse temperature for the monocrystal and ceramic, respectively. This is a measure of relaxation time. The plots illustrate the relaxation time of the monocrystal verses the ceramic. Relaxation time describes an electrical response to a change of voltage in an A.C. circuit. As demonstrated in the figures, in addition to systematically faster relaxation times ($\tau_p$) across the entire temperature range for each constant frequency curve, greater uniformity in the slope for the monocrystal as opposed to the ceramic was observed.

Impedance arcs of the monocrystal and ceramic polycrystal (see FIGS. 6a and 6b, respectively) show clear evidence for grain boundary effects in the ceramic. All of the subsequent figures illustrate how this profound difference in microstructure affects the performance of the cubic spinels of this specific metal oxide system. The preparation of single crystals of this material has revealed the nature of the grain boundary effects in ceramics of this specific system and their influence upon performance of devices made from the nickel-manganese-cobalt oxide monocrystals of the present invention.

These monocrystals, with no grain boundaries, have greatly reduced dispersion effects, faster electric relaxation times and thermal response times. Clearly, the absence of charge carrier-grain boundary scattering results in electric field effects and transport processes that differ from the ceramic counterparts. The intergranular structure of the ceramic polycrystal makes these physical properties unpredictable, and more difficult to understand and control than those of monocrystals. It appears that a standard thermistor now can be prepared from a single crystal and used to evaluate the performance of ceramic devices.

The principles, preferred embodiments and modes of operation of the present invention have been described in the foregoing specification. The invention which is intended to be protected herein, however, is not to be construed as limited to the particular embodiments disclosed, since these are to be regarded as illustrative rather than restrictive. Variations and changes may be made by others without departing from the spirit and scope of the invention.

CITATIONS

The text of the references and in particular, the pages indicated below are hereby incorporated by reference.
(1) D. G. Wickham, "Solid-Phase Equilibria In The System NiO—$Mn_2O_3$—$O_2$", J. Inorg. Nucl. Chem., 26, (1964), 1369–1377.
(2) E. G. Larson, R. J. Arnott and D. G. Wickham, "Preparation, Semiconduction And Low-Temperature Magnetization of the System $Ni_{1-x}Mn_{2+x}O_4$" J. Phys. Chem. Solids, 23, (1962), 1771–1781.

(3) D. G. Wickham and W. J. Croft, "Crystallographic and Magnetic Properties of Several Spinels Containing Trivalent Manganese", *J. Phys. Chem. Solids*, Pergamon Press, 7 (1958), 351–360.

(4) E. M. Levin and Clyde McDaniel, *J. Am. Ceram. Soc.*, 45, [8] 356 (1962) and in particular, FIG. 323 thereof.

We claim:

1. A monocrystal of nickel-cobalt-manganese oxide having a cubic spinel structure.

2. The monocrystal of claim 1 having an atomic ratio R=Mn/(Ni+Co+Mn) which ranges from between about 0.1 and about 0.8 for Mn.

3. The monocrystal of claim 1 having a lattice parameter between about 8.1 and about 8.45 Å.

4. A sensor capable of detecting temperatures comprising a sensing element including a monocrystal nickel-cobalt-manganese oxide having a cubic spinel structure and a pair of terminals in contact with said sensing element, whereby electrical resistance between said terminals will vary with the temperature of said sensing element.

5. The sensor of claim 4 wherein said terminals are in substantially ohmic contact with said sensing element.

6. The sensor of claim 5 wherein said terminals are formed from metals selected from the group consisting of noble metals and copper and alloys thereof.

7. The sensor of claim 4 further comprising at least one lead connected to each of said terminals.

8. The sensor of claim 7 further comprising a housing supporting and enclosing at least a portion of said sensing element.

9. The sensor of claim 4 further comprising means for measuring the electrical resistance between said terminals to thereby measure the temperature of said element.

10. The sensor of claim 4 wherein said sensor is capable of detecting temperatures within the range of −70° C. to 200° C.

* * * * *

UNITED STATES PATENT AND TRADEMARK OFFICE
CERTIFICATE OF CORRECTION

PATENT NO. : 6,076,965
DATED : June 20, 2000
INVENTOR(S) : Rosen et al.

Page 1 of 1

It is certified that error appears in the above-identified patent and that said Letters Patent is hereby corrected as shown below:

Title Page, Item [73], "Therometrics" should read --Thermometrics--.

Title Page, under Attorney, Agent, or Firm, "Krumholtz" should read --Krumholz--.

Column 1,
Line 7, "Appln" should read --Application-- (both occurrences).

Column 11,
Line 50, "(T/T)" should read --(1/T)--.

Column 13,
Line 11, delete "from".

Signed and Sealed this

Third Day of July, 2001

*Attest:*

*Attesting Officer*

NICHOLAS P. GODICI
*Acting Director of the United States Patent and Trademark Office*